(12) United States Patent
Janneck et al.

(10) Patent No.: US 8,146,040 B1
(45) Date of Patent: Mar. 27, 2012

(54) METHOD OF EVALUATING AN ARCHITECTURE FOR AN INTEGRATED CIRCUIT DEVICE

(75) Inventors: Jorn W. Janneck, San Jose, CA (US); David B. Parlour, Pittsburgh, PA (US); Ian D. Miller, Charlotte, NC (US)

(73) Assignee: Xilinx, Inc., San Jose, CA (US)

( * ) Notice: Subject to any disclaimer, the term of this patent is extended or adjusted under 35 U.S.C. 154(b) by 331 days.

(21) Appl. No.: 12/482,687

(22) Filed: Jun. 11, 2009

(51) Int. Cl.
*G06F 17/50* (2006.01)

(52) U.S. Cl. ........ 716/116; 716/104; 716/106; 716/117; 716/132; 703/22

(58) Field of Classification Search ................. 716/104, 716/106, 116, 117, 132; 703/22; 708/200
See application file for complete search history.

(56) References Cited

U.S. PATENT DOCUMENTS

| | | | | |
|---|---|---|---|---|
| 6,067,412 | A * | 5/2000 | Blake et al. | 718/102 |
| 6,560,569 | B1 * | 5/2003 | Abu El Ata | 703/2 |
| 7,031,901 | B2 * | 4/2006 | Abu El Ata | 703/21 |
| 7,793,011 | B2 * | 9/2010 | Gunnels et al. | 710/22 |
| 2002/0156611 | A1 * | 10/2002 | Lenormand | 703/22 |
| 2009/0006072 | A1 * | 1/2009 | Bliss et al. | 703/22 |

OTHER PUBLICATIONS

U.S. Appl. No. 11/373,745, filed Mar. 10, 2006, Janneck et al.
U.S. Appl. No. 12/041,167, filed Mar. 3, 2008, Shumacher et al.
U.S. Appl. No. 12/041,182, filed Mar. 3, 2008, Shumacher et al.
Eker, Johan et al., *CAL Actor Language*, May 6, 2002, pp. 1-58, Language Report Draft 1st public release, University of California at Berkeley, Berkeley, California, USA.
Eker, Johan et al., *CAL Language Report*, Dec. 1, 2003, pp. 1-112, ERL Technical Memo UCB/ERL Berkeley M03/48, University of California at Berkeley, Berkeley, California, USA.

* cited by examiner

*Primary Examiner* — Thuan Do
*Assistant Examiner* — Nha Nguyen
(74) *Attorney, Agent, or Firm* — John J. King; Lois D. Cartier (57) ABSTRACT

A method of evaluating an architecture for an integrated circuit device is disclosed. The method comprises generating a library of primitives for a predetermined architecture; transforming an original dataflow program into an intermediate format; transforming the intermediate format to a dataflow program defined in terms of the predefined library of primitives; and generating an implementation profile comprising information related to an implementation of the original dataflow program in an integrated circuit having the predetermined architecture. A method of evaluating an architecture for an integrated circuit device is also disclosed.

19 Claims, 6 Drawing Sheets

METHOD OF EVALUATING AN ARCHITECTURE FOR AN INTEGRATED CIRCUIT DEVICE

FIELD OF THE INVENTION

The present invention relates generally to integrated circuits, and in particular, to a method of evaluating an architecture for an integrated circuit.

BACKGROUND OF THE INVENTION

Integrated circuits are implemented in a variety of devices and may be configured to provide a variety of functions. As with any other component of a device, one type of integrated circuit may be better suited for implementing a particular function than another type of integrated circuit. The performance of an integrated circuit implementing a function may depend upon the architecture of the integrated circuit, for example. While architectures of integrated circuits may vary according to a number of different criteria, one type of integrated circuit which may be implemented with a predetermined architecture is a programmable logic device. As will be described in more detail below, programmable logic device may comprise a variety of blocks which may have various functions.

When running an application on an integrated circuit such as a programmable logic device, certain applications may perform differently on integrated circuits having different architectures. In order to evaluate the performance of an integrated circuit device, it is necessary to benchmark the integrated circuit. Traditionally, benchmarking an architecture of an integrated circuit is done by constructing a simulation environment for that architecture, and then mapping a set of benchmark applications to that architecture. However, conventional methods require a costly and time-consuming process, especially in the early stages of defining an architecture when many features of the architecture are still speculative and subject to change.

SUMMARY OF THE INVENTION

A method of evaluating an architecture for an integrated circuit device is disclosed. The method comprises generating a library of primitives for a predetermined architecture; transforming an original dataflow program into an intermediate format; transforming the intermediate format to a dataflow program defined in terms of the predefined library of primitives; and generating an implementation profile comprising information related to the implementation of the original dataflow program in an integrated circuit having the predetermined architecture.

According to an alternate embodiment, a method of evaluating an architecture for an integrated circuit device comprises generating a predefined library of primitives for a predetermined architecture; transforming an original dataflow program into an intermediate format; transforming the intermediate format to a dataflow program defined in terms of the predefined library of primitives for the predetermined architecture; recording computational steps in implementing the dataflow program defined in terms of the predefined library of primitives; and generating an implementation profile comprising information related to the implementation of the original dataflow program in an integrated circuit having the predetermined architecture.

A computer program product is also disclosed. The computer program product comprises computer-readable program code that generates a library of primitives for a predetermined architecture; computer-readable program code that converts an original dataflow program into an intermediate format; computer-readable program code that converts the intermediate format to a dataflow program defined in terms of the predefined library of primitives; and computer-readable program code that generates an implementation profile comprising information related to the implementation of the original dataflow program in an integrated circuit having the predetermined architecture.

DETAILED DESCRIPTION

Figure 1:
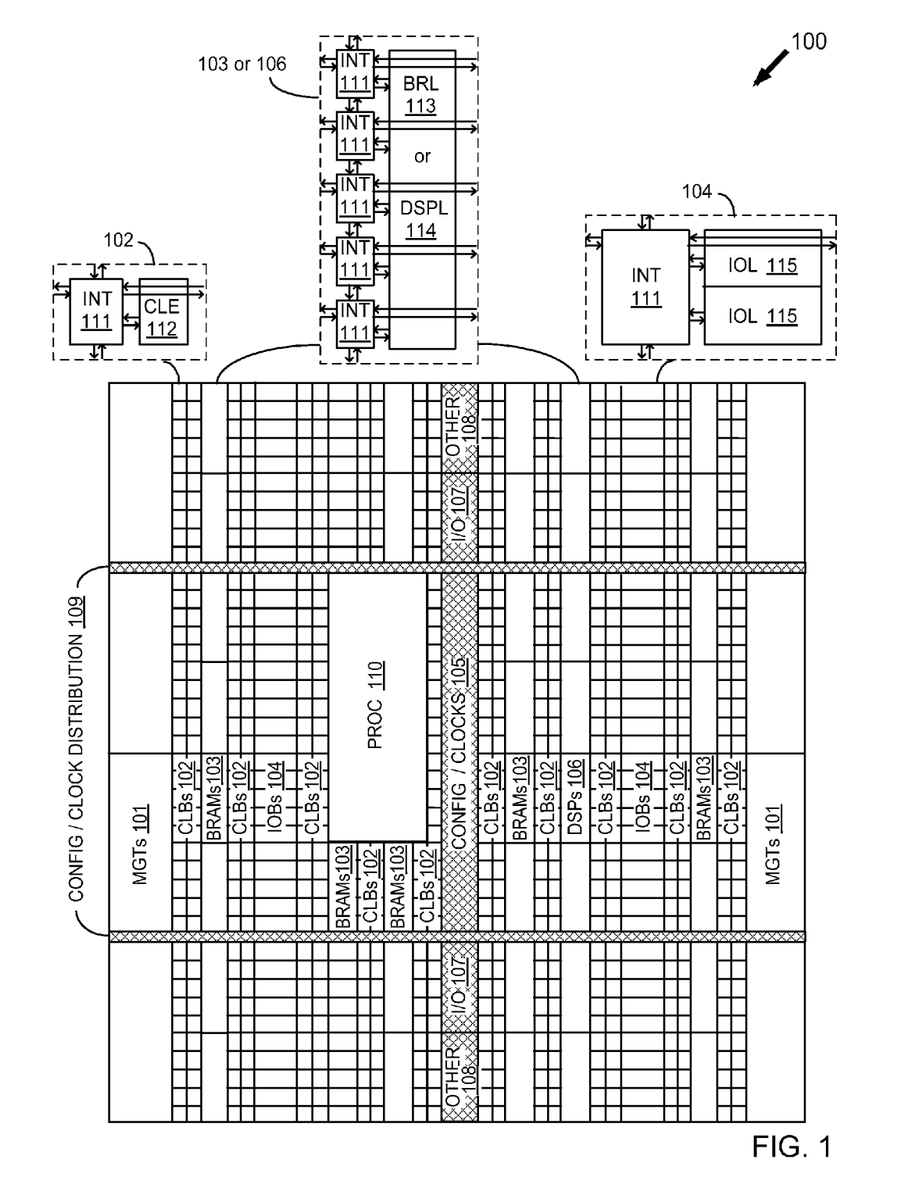
FIG. 1 is a block diagram of a device having programmable logic according to an embodiment the present invention.

Turning first to FIG. 1, a block diagram of a device having programmable logic according to an embodiment the present invention is shown. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
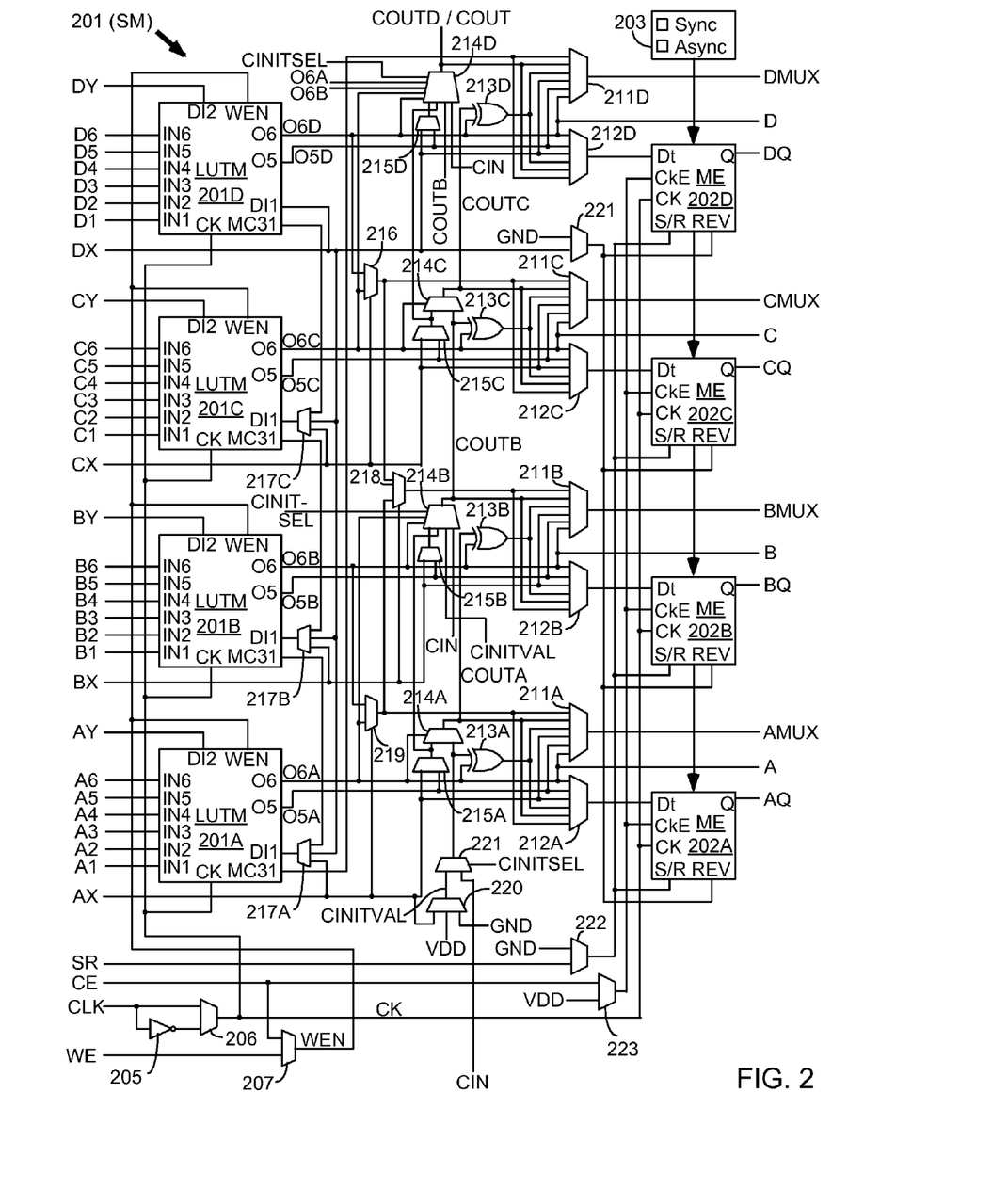
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. The methods of the present invention may be implemented according to the device of FIGS. 1 and 2, or in any device, including any type of integrated circuit having programmable logic.

Figure 3:
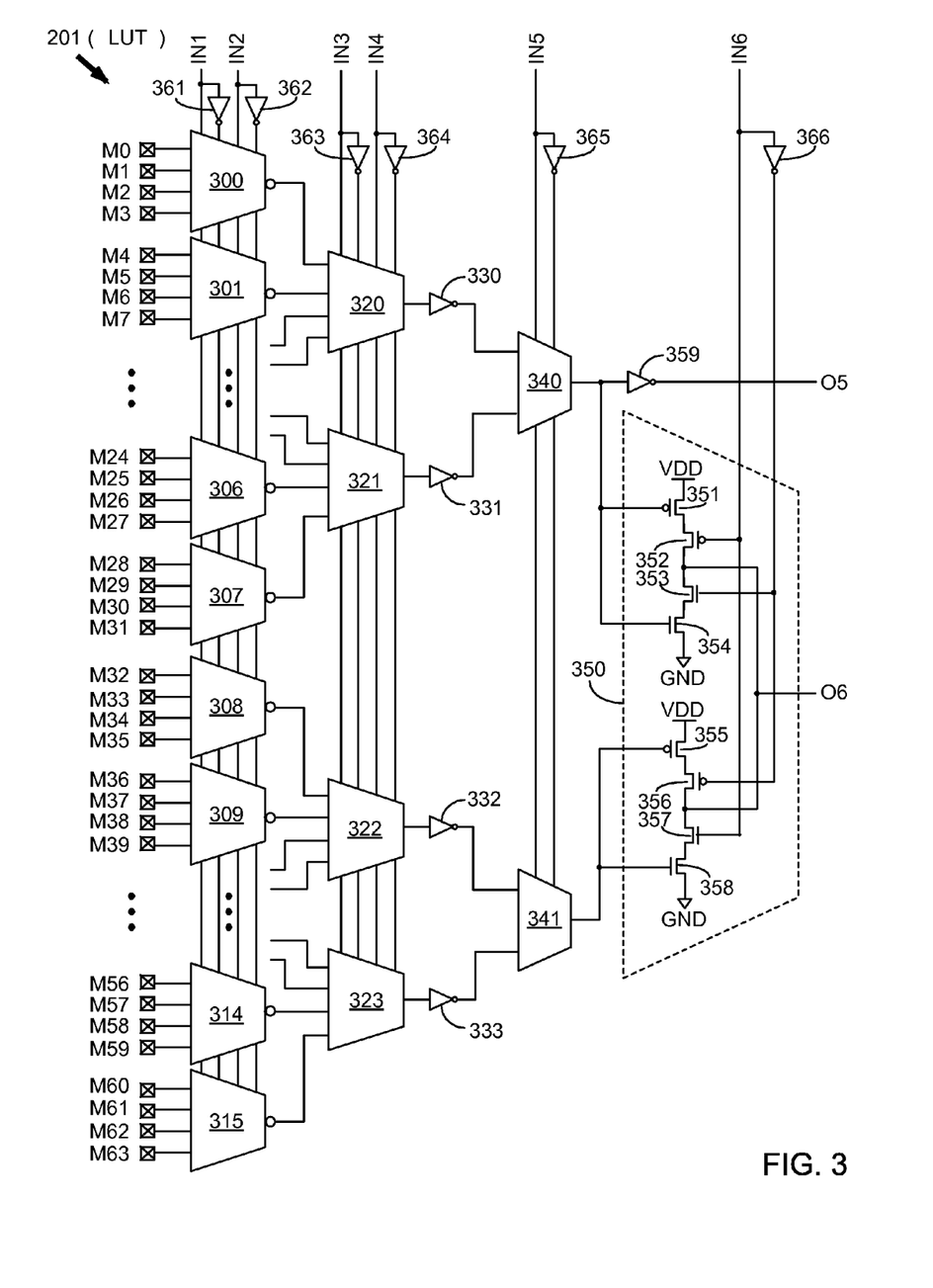
FIG. 3 is a block diagram of the look-up table of the configurable logic element of FIG. 2 according to an embodiment of the present invention.

Turning now to FIG. 3, a block diagram of the look-up table of the configurable logic element of FIG. 2 according to an embodiment of the present invention is shown. In the embodiment of FIG. 3, configuration memory cells M0-M63 drive 4-to-1 multiplexers 300-315, which are controlled by input signals IN1, IN2 and their inverted counterparts (provided by inverters 361, 362) to select 16 of the signals from the configuration memory cells. The selected 16 signals drive four 4-to-1 multiplexers 320-323, which are controlled by input signals IN3, IN4 and their inverted counterparts (provided by inverters 363, 364) to select four of the signals to drive inverters 330-333. Inverters 330-333 drive 2-to-1 multiplexers 340-341, which are controlled by input signal IN5 and its inverted counterpart (provided by inverter 365). The output of multiplexer 340 is inverted by inverter 359 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 3 shows bubbles on the output terminals of multiplexers 300-315, which signifies an inversion (e.g., an inverter) on the output of each of these multiplexers.

Multiplexers 340 and 341 both drive data input terminals of multiplexer 350, which is controlled by input signal IN6 and its inverted counterpart (provided by inverter 366) to select either of the two signals from multiplexers 340-341 to drive output terminal O6. Thus, output signal O6 can either provide any function of up to five input signals IN1-IN5 (when multiplexer 350 selects the output of multiplexer 341, i.e., when signal IN6 is high), or any function of up to six input signals IN1-IN6. In the pictured embodiment, multiplexer 350 is implemented as two three-state buffers, where one buffer is driving and the other buffer is disabled at all times. The first buffer includes transistors 351-354, and the second buffer includes transistors 355-358, coupled together as shown in FIG. 3. The memory cells M0-M63 may be periodically read back to ensure that the values have not been inadvertently changed.

Figure 4:
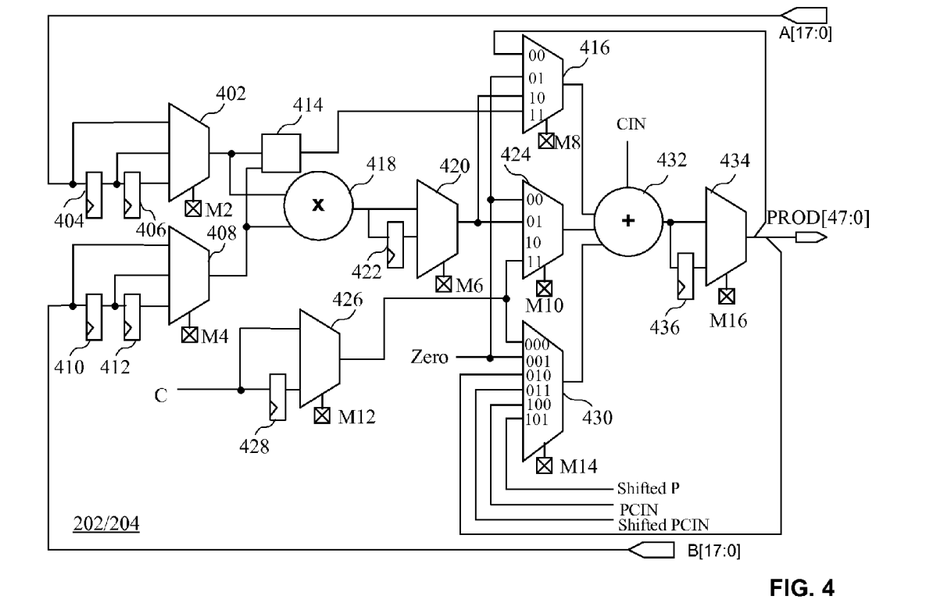
FIG. 4 is a block diagram of a multiplier/adder stage of a DSP block of FIG. 1 according to an embodiment of the present invention.

Turning now to FIG. 4, a block diagram of a multiplier/adder stage of a DSP block of FIG. 1 according to an embodiment of the present invention is shown. The circuit of FIG. 4 comprises a DSP block configured to perform different functions, based upon the value of memory elements set to configure the DSP block. The value of the memory elements are downloaded to the DSP block as a part of a configuration bitstream for programming a programmable logic device, as is well know in the art. In particular, a multiplexer 402 is coupled to receive a value at an A input or one of two registered inputs stored in registers 404 and 406 based upon the value stored in a memory element M2. A multiplexer 408 is coupled to receive a value at a B input or one of two registered inputs stored in registers 410 and 412 based upon the value stored in a memory element M4. A concatenator circuit 414 is coupled to receive the output of the multiplexers 402 and 408, the concatenated output of which is coupled to a multiplexer 416. In addition to receiving the output P of the circuit at an input, multiplexer 416 will also receive the output of a multiplier 418, which is the product of the outputs of the multiplexers 402 and 408, or a registered product stored in a register 422. The multiplexer 416 is also coupled to receive a ZERO input. A multiplexer 424 is coupled to receive the output of the multiplexer 420, the ZERO signal, and the output of a multiplexer 426, which is coupled to receive a "C" input or a registered "C" input stored in register 428. A multiplexer 430 is coupled to receive the output of the multiplexer 426, the ZERO value, the output P of the circuit and a shifted version of the output P of the circuit. The multiplexer 430 also receives a PCIN signal and a shifted PCIN signal. The adder 432 also receives the carry-in value (CIN). The output of the adder 432 is coupled to a multiplexer 434 which is also coupled to receive a registered value of the output of the adder 432 stored in a register 436 based upon a value of a memory element M16. The output of the multiplexer 434 comprises the product P (PROD[47:0]). While certain embodiments of CLEs and DSP blocks are shown, other CLE and DSP blocks could be employed. More specifically, the integrated circuit architecture may be defined not only by the type of locations of circuit blocks which are employed in the integrated circuit, but also the structure of the specific blocks. That is, a DSP block may be implemented according to different architectures. As will be described in more detail below, the methods of the present invention enable analyzing variations of architectures such as the types of architectures than those implemented in FIGS. 1-4, or completely different architectures.

Figure 5:
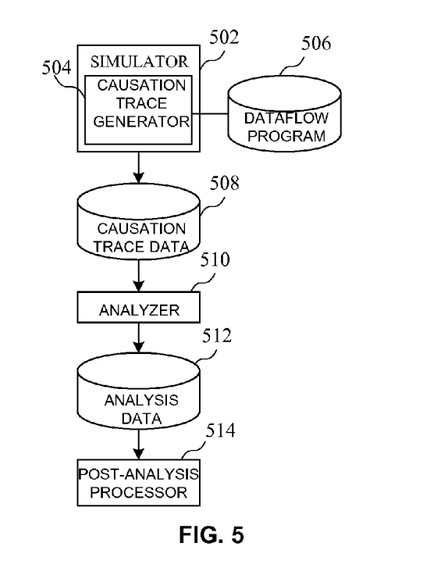
FIG. 5 is a flow diagram of a process for generating causation traces according to an embodiment of the present invention.

Turning now to FIG. 5, a block diagram of a system for generating causation traces according to an embodiment of the present invention is shown. As will be described in more detail below, causation traces are used to evaluate the performance of an integrated circuit architecture, and more particularly, how a certain application implemented in the integrated circuit performs. By way of example, a certain application or function implemented by the device may be a decoder, such as a Moving Picture Experts Group (MPEG) decoder for decoding MPEG video data. As will be described in more detail below, a simulator 502 transforms an original dataflow program into an intermediate form. The simulator 502 also includes a causation trace generator 504 which is configured to generate at least one causation trace in response to the simulation of a dataflow program 506. The operation of transforming an original dataflow program may be implemented in computer-readable code running on a computer functioning as a simulator. A "causation trace" of a system is the result of recording, during a simulation, the computational steps that were performed by the original data flow program or any dataflow programs generated based upon the original dataflow program, as well as the dependencies among the steps, in response to particular input data. A computational step comprises a function or operation implemented by the dataflow program. For example, the computational steps may be the implementation of an arithmetic function defined in the dataflow program in various blocks of a device, such as CLEs or DSPs of a PLD. A first computational step of a dataflow program is dependent on another step if the other step (or some part of it) has to be completed, and its results made available, for the first computational step to execute. The causation trace generator 504 produces causation trace data 508 as an output. As will be described in more detail below, causation traces will generated based upon an implementation model representing an original dataflow program in terms of primitives associated with a different architecture.

The causation trace data 508 may include one or more causation traces. For example, the causation trace generator 504 may produce a causation trace for each run of the simulator 502 using various sets of input data. The input data comprises the data being operated on by the dataflow program. In a circuit implementing an MPEG decoder, for example, the input data would be MPEG video data. A causation trace effectively provides hindsight into how the various steps of a particular run through the simulator 502 are related to one another. In contrast, static analyses, as well as runtime decisions, are made at points in time when much of that dependency structure is still unknown. An analyzer 510 is configured to receive the causation trace data 508 and perform one or more analyses using the causation trace data 508 to produce analysis data 512. Using the embodiments of FIGS. 1-4, the analysis data may include data for different configurations of elements in the PLD. For example, the analysis data may include data for implementing functions using all CLBs, or implementing functions using a combination of CLBs and DSPs. Finally, a post-analysis processor 514 provides post processing analysis. An implementation profile may be generated before or after post-analysis processing. For example, the implementation profile may be expressed with different resources required or provide different performance criteria, such as the speed of the circuit implemented in the device.

In one embodiment, the dataflow program 506 is specified using a concurrent programming language. A concurrent programming language is a language that reflects a concurrent programming model, rather than a conventional sequential programming model. The dataflow program 506 includes programming constructs that define a network of processes interconnected by communication channels, providing an implementation-independent software model of a concurrent system. Each process is described by the inputs and outputs it has, the actions it can perform, the rules for triggering the actions ("firings"), and the persistent state between firings. The process description does not imply an implementation technology, such as processor software, ASIC hardware, or FPGA hardware.

In one embodiment, the dataflow program 506 is specified using an actor language known as the CAL programming language. For purposes of clarity, an embodiment of the invention is described below with specific reference to the CAL programming language by way of example. A description of the CAL programming language is given in the "CAL language Report", by Eker and Janneck, ERL technical Memo UCB/ERL M03/48, University of California at Berkeley, Dec. 1, 2003, which is herein incorporated by reference. Those skilled in the art will appreciate that the invention may be used with other languages that reflect concurrent programming models, such as SystemC.

Figure 6:
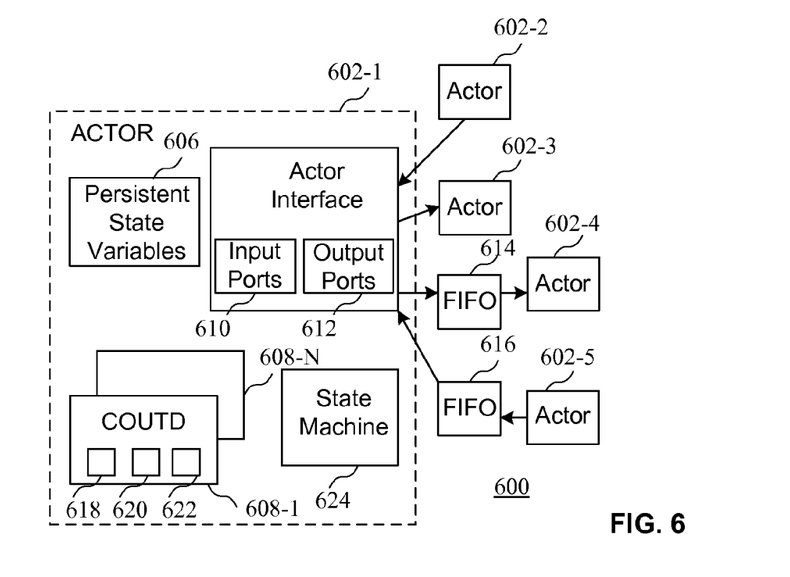
FIG. 6 is a block diagram of a software architecture according to an embodiment of the present invention.

Turning now to FIG. 6, a block diagram of elements of a system for enabling architectural profiling according to an embodiment of the present invention. The dataflow program 506 may include units referred to as actors, which model the processes of a concurrent system. Actors communicate through ports and are opaque (i.e., their internal state is not visible outside the actor). The ports are unidirectional (i.e. either input or output ports) and they communicate tokens, which are discrete units of data. Actors consume or produce discrete tokens as a result of action firings. The connections between actors, which model the communication channels of the concurrent system, represent a higher level of abstraction than simple wires. Channels may have memory, and it is possible for an actor to check the availability and value of tokens at its input ports.

Referring specifically to FIG. 6, a program 600 includes actors 602-1 through 602-5, by way of example. While only the actor 602-1 is shown in detail for clarity, it is to be understood that the actors 602-2 through 602-5 are similar to the actor 602-1. The actor 602-1 includes an actor interface 604, persistent variables 606, and actions 608-1 through 608-N (collectively referred to as actions 608), where N is an integer greater than zero. The actor interface 604 may include one or more input ports 610 and one or more output ports 612. In some cases, the actor interface 604 may include only output ports 612 or the input ports 610. In the present example, the actor interface 604 may receive tokens directly from the actor 602-2 and provides tokens directly to the actor 602-3. The actor interface 604 provides tokens to the actor 602-4 through a first-in-first-out memory (FIFO) model 614, and receives tokens from the actor 602-5 through a FIFO model 616. In terms of physical implementation, the circuit that implements the actor 602-1 communicates with the circuits that implement the actors 602-2 and 602-3 synchronously and the circuits that implement the actors 602-4 and 602-5 asynchronously. The program 600 need not specify the storage mechanism of the communication channels. While a programmer may assume that the channel depth is infinite. Automatic or manual analysis of the actor network may be used to determine the required channel depths for correct program operation.

The persistent variables 606 store the state of the actor 602-1. The values of the persistent variables 606 are readable and writeable by any of the actions 608. Notably, the persistent variables 606 have actor-scope in that they are accessible only from within the actor 602-1. In terms of actual physical implementation, the persistent variables 606 may be registers or multi-port memories with associated controls and multiplexing logic.

Each of the actions 608 is configured to read some number of tokens from various ones of the input ports 610 and write some number of tokens to various ones of the output ports 612. Alternatively, an action may be configured to just read tokens from input ports and produce no output tokens, or an action may be configured to just write tokens to output ports and receive no input tokens. In any case, each of the actions 608 includes firing rule data 618 that dictates when the action may "fire" (i.e., execute its described operation). In one embodiment, an action only fires if the necessary input tokens are present at the input ports 610 ("default firing rule"). Alternatively, or in addition to the default firing rule, an action may fire based on one or more guard conditions that must be true for the action to fire. Guard conditions may be Boolean expressions that test any persistent state variable of the actor or input token.

Each of the actions 608 may also include one or more local variables 620. The value of the local variables 620 do not persist from firing to firing, but may be used to hold temporary or intermediate results during execution of a particular firing. Each of the actions 608 may include procedural instruction data 622. The procedural instruction data 622 includes a sequence of instructions that is executed during a firing. Notably, the simplest action merely copies from an input to an output and thus has no procedural instruction data 622. The procedural instruction data 622 may include various constructs, such as assignments, flow control (e.g., if/else, loops), and the like.

Notably, each firing of an action is atomic. That is, no other action may read or write to any resource that is written to or read by an action whose firing is already underway (including the use of resources in guard conditions). Provided that the rule of atomicity is observed, multiple actions are permitted to execute concurrently. In this manner, the program 600 employs a concurrent programming model.

An action may implement state-machine like behavior using the procedural instruction data 622 by modifying persistent variables of the actor 602-1 and testing them in guard conditions. In one embodiment, the actor 602-1 may include a state machine declaration 624. The state machine declaration 624 declares a state machine in finite state machine (FSM) form by an initial state and any number of state transitions that accompany the firing of one or more of the actions 608. The source states for the transitions become additional requirements for the action firings that are logically ANDed with the other firing rules, described above.

In the present example, a computational step identified by a causation trace generator is the firing of an action. The firing of an action may depend on the firing of another action through various dependencies. One type of dependency is a "state dependency". If both actions are part of the same actor, they may depend on each other by using the same state elements (e.g., the same variable). There are two kinds of state dependency: write/read (WR) and read/write (RW) dependencies. A WR dependency exists between two steps if the earlier one writes to a variable and the later one reads that value without intervening write operations. A RW dependency exists between two actions if the earlier one reads a variable and the later one writes to the variable.

Another type of dependency is a "scheduler dependency". This dependency may be considered a special case of the WR state dependency, as it connects to actions (of the same actor) that are related via the scheduler state machine of the actor. If executing an action causes the actor to make a state transition in its scheduler state machine, then this action, and the action whose execution made the actor go into the state at the beginning of the transition, are linked by a scheduler dependency.

Another type of dependency is a "port dependency". If both actions are part of the same actor, they may use the same input/output ports to receive or send tokens, in which case they need to access those ports in the order in which they were fired in the simulator. If two actions are only port dependent, their computations can be performed entirely in parallel, as long as the tokens enter and exit the actions in the proper order.

Another type of dependency is a 'token dependency". Two actions may depend on each other because one of them is producing a token that is consumed by the other. In this case, those actions may be in different actors, or they may be part of the same actor in case of a direct dataflow feedback loop.

In the present example, a causation trace produced by a causation trace generator is a record of the actual dependencies of actions in a particular run in a simulator, acting on a particular set of inputs. In one embodiment, a causation trace generator maintains a table of information during the simulation of the dataflow program, which is used to generate the dependencies. The types of data recorded depend on the types of dependencies to be determined. For example, for each actor state variable, the last action firing in which the actor state variable was modified is recorded. This can be used to determine state dependency between two computational steps. For each port, the last action firing that either read or wrote to the port is recorded. This would be used to determine port dependency between two computational steps. For each token inside an input queue, the action firing in which the token arrived at that queue is recorded. This can be used to determine token dependency between two computational steps. If an actor has a scheduler state machine, the last labeled action (i.e., an action associated with states of the state machine) that was executed for this actor is recorded. This can be used to determine scheduler dependency between two computational steps.

Dependencies may be generated according to the following rules. If a state variable is read in a step, then this implies a dependency from the last step in which that variable was modified to the current step. If a token crosses a port, either by being read from or by being written to it, this implies: (1) a port dependency from the last step in which a token crossed that port to the current step; and (2) in case of a token being read, a token dependency from the step in which the token arrived at the queue to the current step. If the actor has a scheduler state machine and the action executed in this step is labeled, this implies a scheduler dependency between the last step in which a labeled action of this actor was executed and the current step.

The methods of the present invention leverage causation trace profiling of dataflow programs in order to obtain quantitative information about implementation architectures. An architecture may comprise the arrangement of elements which are used to implement circuits in the integrated circuits. In particular, it may relate to the blocks which may be implemented and/or the arrangements of the blocks. According to some embodiments, the architecture may depend upon an implementation of a given block. As shown in the device having programmable logic of FIG. 1, certain blocks are implemented, and placed in a certain arrangement. In FIG. 1, the majority of the columns comprise a single type of block and are provided in a certain location on the device. The arrangement of the blocks in FIG. 1 could be changed. Further, some or all of the blocks in FIG. 1 could be implemented with a different structure (e.g. a CLB could be implemented using one configuration in one architecture and using a different configuration in another architecture). Also, blocks other than those shown in FIG. 1 could be used. For example, even an entirely different kind of PLD consisting of asynchronously connected word-level ALU-type building blocks instead of LUTs and CLBs could be employed.

According to one aspect of the invention, the methods of the present invention permit a detailed analysis of the performance of benchmark applications on new or even hypothetical architectures, without the need to build specialized simulators and mapping tools. A representation of the structure of a concurrent computation, and a method for extracting it from a sequential simulation of a dataflow program are described above in reference to FIG. 5. A determined causation trace may be used to analyze properties of the dataflow program, and to experiment quickly with a variety of hypothetical implementation scenarios, using techniques such as structural trace analysis and post analysis processing. These techniques focus mostly on the properties of the application. While they do involve a representation of the mapping of the dataflow application to an implementation architecture, that architecture itself and the mapping remain abstract, represented purely quantitatively in the form of data for measurements such as the latency, area or power consumption of steps of the application. This abstraction is a useful compromise when the architecture and its properties are well-understood, when there is a reliable translation path from the program of the application to the implementation architecture, and when the application is the object under investigation, which may be possible to trace, profile, and as a result modify.

However, when designing an architecture and evaluating its performance with respect to a number of reference applications, it may not be easy to provide a translation of the application to the hypothetical architecture. The applications may be known reference applications which may provide useful feedback related to an architecture, or may be one or more new applications for which evaluation is desired. Also, the architecture may not be understood well enough to come up with reliable estimates regarding how parts of the application will perform on the architecture. The methods of the present invention use dataflow programs and causation traces derived from the simulation of the dataflow program in order to profile implementation architectures. Important aspects of the methods include a translation that transforms any dataflow program into another dataflow program which is functionally identical but structurally isomorphic to the implementation on the architecture to be profiled. The new dataflow program includes a library of primitives. The primitives comprise an element provided by the programming language. According to an embodiment of the invention, a primitive may be expressed as dataflow components (actors) which are sufficiently small to have performance characteristics (e.g. latency, area, power etc.) that are either know for a given architecture, or for which we may generate sufficiently good estimates. Such estimates would be necessary for a case where the architecture is hypothetical.

Figure 7:
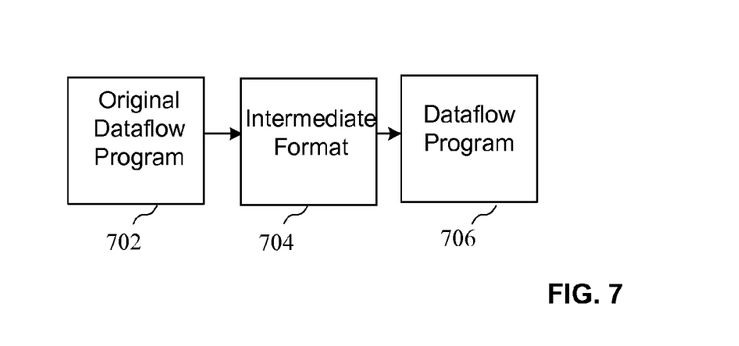
FIG. 7 is a block diagram showing the transformation of an original dataflow program according to an embodiment of the present invention.

Typically, the implementation of a dataflow program to hardware has distinct phases, including compilation of the high-level dataflow program into an intermediate format (IF); code generation of the IF into a hardware program in a Hardware Description Language (HDL), such as VHDL or Verilog; and synthesis of the HDL description into a circuit. The last two steps, which are commonly called the backend, are the most complex part of the tool chain, and also require detailed knowledge about the implementation architecture, and specifically about the primitive entities that it provides for implementing the content described in the IF. When experimenting with hypothetical hardware architecture, it may not be feasible to build the entire backend for each hypothetical architecture under consideration. That is, the amount of work to build the backend is similar to, or may exceed, the construction of a hardware architecture itself. Instead of building a complete backend, the methods of the present invention execute and profile concurrent systems by translating the IF into another dataflow program. That is, a data flow program is converted to an intermediate format which is used to generate an implementation model. Accordingly, as shown in FIG. 7, P is designated as the original dataflow program 702, also known as the design model, IF(P) is its representation in the intermediate format 704, and P' is another dataflow program 706, called the implementation model, that is equivalent to the design model, in the sense that it has identical external behavior. The difference, however, is that while P is the original application as entered by the programmer, P' is a program that is expressed in terms of a predefined library of building blocks, each with known or estimated performance characteristics for a given architecture. A library represents the capabilities of the underlying implementation architecture, and that every element in P' represents a physical part of the implementation.

For the purposes of architectural profiling, the properties of a specific architecture are represented in three parts: the translator from the IF to P', the library of primitives, and the performance properties of each primitive, such as latency, area, and power. Further, the architectural profiling may be based upon causation traces for the dataflow program P'. In practice, the first two are identical for many hypothetical architectures, and only the performance properties of the primitives vary from one architecture to another. But even if the translator and the library have to be customized for a given architecture, this task should still be significantly easier to accomplish than building an entire implementation backend.

While the structure of P and P' will typically be significantly different, they are related, as P' is generated from P. In considering a dataflow program in a concurrent programming language, I(a) is designated as the set of actors in the implementation P' that represent the actor a in the design P. In the simplest case, an actor a in P will be exclusively represented by a set of actors I(a) in P', where "exclusively" means that the resulting actors in I(a) are only affected by a, and not by anything else. Consequently, for any two actor a, b in the design, the intersection between I(a) and I(b) is equal to 0 where actor a in P is exclusively represented by the set of actors I(a). A translation which always results in such a P' is called modular, because it means that it is possible to translate the actors in P independently from one another, and then compose the resulting sets of actors.

However, more sophisticated translations may map actors in P to overlapping sets of actors in P'. That is, it may happen that for two distinct actors a, b in P, there is an intersection between I(a) and I(b). Such a translation is called a folding translation because actors in P' are physical elements of the implementation of P. Mapping two distinct actors in P, at least in part, into the same element of P' means that they are effectively "folded" onto the same implementation element.

Like the static structures of the dataflow programs themselves, the causation trace of P representing the design trace will be different from the causation trace of P' representing the implementation trace. In general, a back annotation structure must be assumed, where the back annotation structure relates the steps in the design trace to those in the implementation trace. That is, any step s in the design trace will be implemented by a set of steps I(s) in the implementation trace. In the simplest case of a modular translation, the steps S(a) of each actor a in P are represented completely and exclusively by the steps of the actors representing it in the implementation, i.e., by those in I(a). For folding translations, the situation is more complex, where an actor w in P' may contribute to the implementation of more than one actor in the design, such as a, b. If every step of w in the implementation trace contributes to the computation of at most one design actor, the folding translation is considered to be a time-multiplexing transaction. Otherwise, if the same step in the implementation may contribute to more than one step by two different actors in the design, the translation is considered a packing translation. Packing translations represent a problem if it is desirable to back annotate performance metrics to the original applications. For example, it may be learned that an implementation step consumed a certain amount of energy. However, if that step really contributed to the execution of more than one actor in the design, then it will be difficult to account accurately for the consumed power for each actor.

For applications which serve essentially as benchmarks for the profiling of an architecture, back annotation is less relevant. However, back annotation may become more relevant if it is desired to not only determine how well an architecture executes a set of applications, but also why the architecture performs the way it does. In that case, if a packing translation is used, a strategy to account for packed steps, such as splitting the effort between the design steps implemented by a given packed step, must be employed. When using a suite of benchmark applications to evaluate an architecture, the resulting metrics do not describe the architecture as such, but the process that maps the applications to that architecture. However, because a dataflow program exposes more concurrency and thus provides a better representation of the structure of the computation, the translation should make it less susceptible to mapping artifacts.

Static profiling describes the process of collecting those metrics that may be gathered without executing either the design model or the implementation model. Because the elements of the implementation model are assumed to relate 1:1 to elements of the actual implementation and relevant information about the primitives is known, it may be used to generate metrics such as a size of the implementation, a proportion of different kinds of basic building blocks/primitives, and a connectedness/topology of the implementation. In contrast, dynamic profiling of an architecture is based on an analysis of the implementation trace, and sometimes the design trace as well. Techniques such as post-mortem scheduling and trace analysis to the implementation trace result in information such as latency (for the entire design or subsystems of it), utilization for each primitive (i.e. the fraction of time that it is active), resource contention (i.e. the amount of time that processing is not done because the resource is busy doing something else), synchronization delays (i.e. amount of time tokens are waiting for other tokens to become ready so processing may proceed), multiplexing penalty (i.e. delay incurred by the fact that two or more actors share an implementation), and power for the entire design, subsystems, or specific parts of the implementation. Focusing on the interaction between primitives, the number of tokens communicated across a channel per time unit, as well as the "burstiness" of the communication may also be determined.

It should be noted that two subsequent executions of the same action need not take the same amount of time or power. Because in general executions of the same action may be data dependent, an action may execute differently on subsequent steps, resulting in different sets of primitives steps in the implementation trace. By relating the implementation steps back to the steps of the design, a distribution may be determined with respect to a particular metric (such as latency or power) for every action of the design model.

Figure 8:
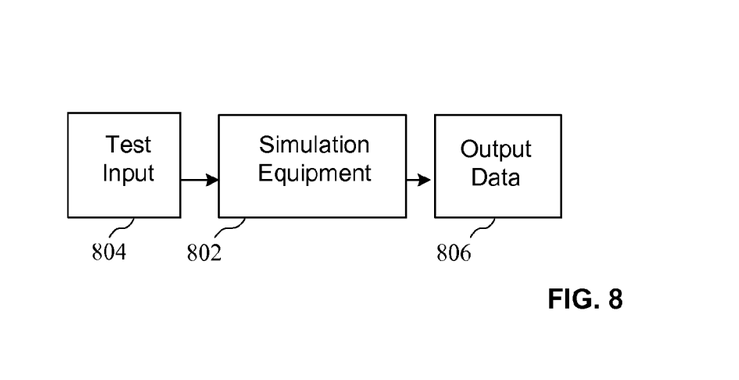
FIG. 8 is a block diagram of simulation equipment according to an embodiment of the present invention.

Turning now to FIG. 8, a block diagram of simulation equipment according to an embodiment of the present invention is shown. In particular, simulation equipments 802, such as a programmable computer, implements a simulator such as simulator 502. The simulation equipment receives test inputs comprising test data for an application to be implemented in a given architecture for a device. The output data 806 comprises results of the simulation, and may include an implementation profile generated as set forth above.

Figure 9:
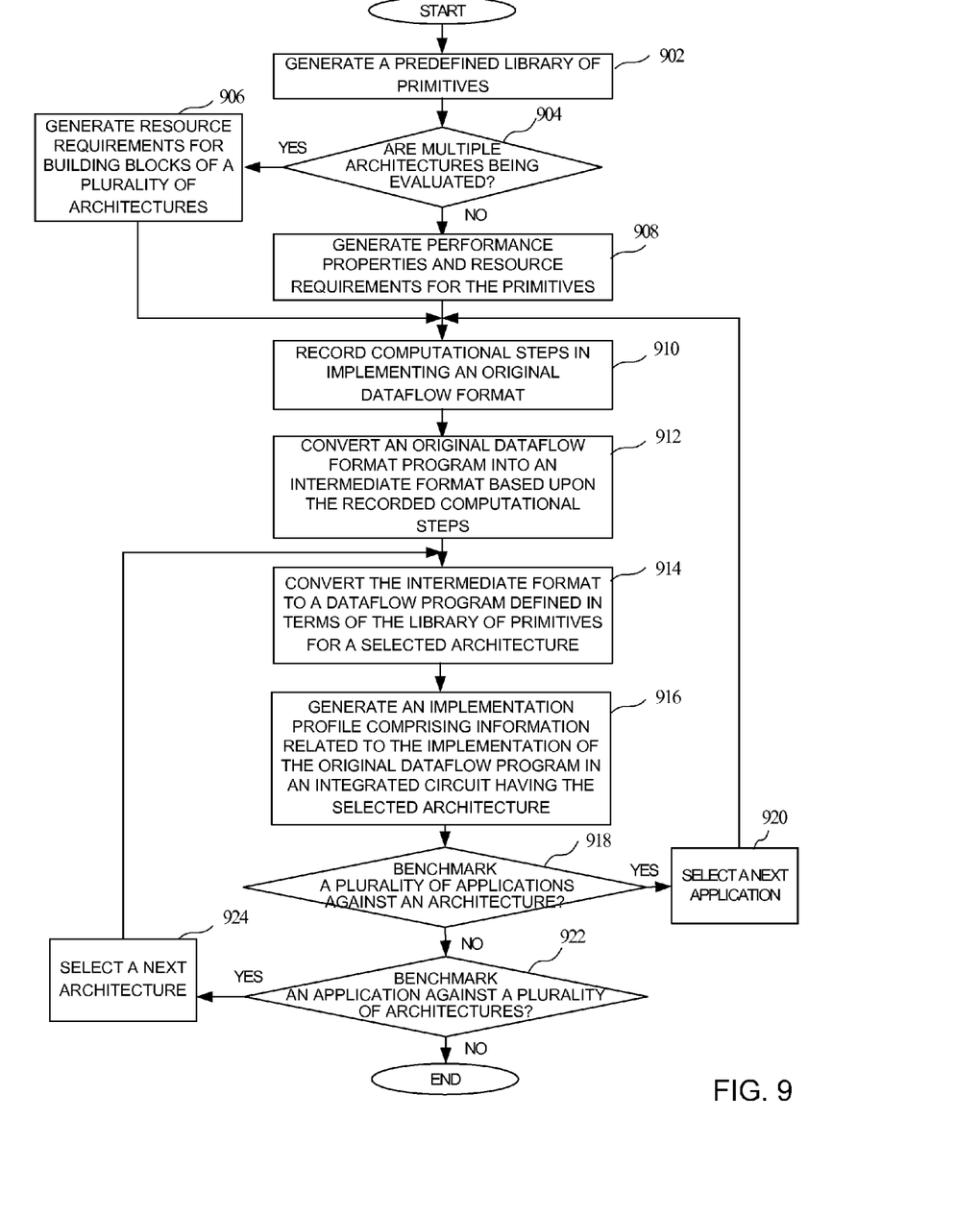
FIG. 9 is a flow chart showing a method of evaluating an architecture of an integrated circuit according to an embodiment of the present invention.

The flow chart of FIG. 9 shows a method of evaluating an architecture of an integrated circuit according to an embodiment of the present invention. The flow chart may be implemented using any of FIGS. 1-4 as described, or any other suitable circuits. The method of FIG. 9 may also be implemented using computer read-able code providing the software arrangements as described in FIGS. 5-6 above. While certain steps are provided in the flowchart of FIG. 9, specific details related to the steps, or additional steps, are set forth in the description of FIGS. 1-8. A predefined library of primitives for a predetermined architecture is generated at a step 902. It is then determined whether multiple architectures are to be evaluated at a step 904. If so, resource requirements are generated for primitives of a plurality of architectures at a step 906. Otherwise, resource requirements for the primitives are generated for a single architecture at a step 908. Computational steps in implementing an original dataflow format are recorded at a step 910. For example, recording computational steps may comprise determining causation traces. An original dataflow format program is converted into an intermediate format based upon the recorded computational steps at a step 912. The intermediate format is converted to a dataflow program defined in terms of the predefined library of primitives for a selected architecture at a step 914. An implementation profile comprising information related to the implementation of the original dataflow program in an integrated circuit having the selected architecture is generated at a step 916. The implementation profile may comprise any information regarding resources of the selected architecture required to implement an application or performance characterization, such as latency, size and power consumption. The implementation profile may be based upon causation traces generated for the dataflow program derived from the original dataflow program. It is then determined whether a design is to be benchmarked against a plurality of architectures at a step 918. If so, a next design to be evaluated is selected at a step 920. It is then determined whether a given application implemented by the dataflow program is to be benchmarked against a plurality of architectures at a step 922. If so, then a next architecture is selected to be evaluated at a step 924, and the implementation profiles are generated until all applications and architectures have been benchmarked.

It can therefore be appreciated that the new and novel method of evaluating an architecture of an integrated circuit device has been described. One benefit of the method of the present invention includes a reduced cost for experimentation, which means designers may explore hypothetical architectures much more quickly and at a reduced cost. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of evaluating an architecture for an integrated circuit device having a plurality of different types of programmable elements, the method comprising:
    generating a library of primitives, which are based upon the plurality of different types of programmable elements, for a predetermined architecture;
    transforming a first dataflow program into an intermediate format;
    transforming the intermediate format to a second dataflow program defined in terms of the predefined library of primitives;
    determining dependencies between computational steps when implementing the second dataflow program during a simulation of the second dataflow program for the predetermined architecture; and
    generating, by using a computer, an implementation profile comprising information related to an implementation of the first dataflow program in an integrated circuit having the predetermined architecture based on the determining of the dependencies and resource requirements of the primitives.

2. The method of claim 1 further comprising a step of generating resource requirements for each primitive of the library of primitives.

3. The method of claim 2 wherein generating resource requirements for each primitive of the library of primitives comprises generating resource requirements based upon an existing architecture.

4. The method of claim 2 wherein generating resource requirements for each primitive of the library of primitives comprises estimating resource requirements based upon resource estimates associated with a hypothetical architecture.

5. The method of claim 2 wherein generating resource requirements for each primitive of the library of primitives comprises generating resource requirements for primitives of a plurality of architectures.

6. The method of claim 5 further comprising benchmarking the first dataflow program against a plurality of architectures.

7. The method of claim 1 further comprising benchmarking a plurality of dataflow programs defined in terms of the predefined library of primitives against the predetermined architecture.

8. A method of evaluating an architecture for an integrated circuit device having a plurality of different types of programmable elements, the method comprising:
   generating a predefined library of primitives, which are based upon the plurality of different types of programmable elements, for a predetermined architecture;
   transforming a first dataflow program into an intermediate format;
   transforming the intermediate format to a second dataflow program defined in terms of the predefined library of primitives for the predetermined architecture;
   recording computational steps in implementing the second dataflow program defined in terms of the predefined library of primitives during a simulation of the second dataflow program defined in terms of the predefined library of primitives for the predetermined architecture; and
   generating, by using a computer, an implementation profile comprising information related to the implementation of the first dataflow program in an integrated circuit having the predetermined architecture using the recorded computational steps in the implementation of the second dataflow program defined in terms of the predefined library of primitives and resource requirements of the primitives.

9. The method of claim 8 wherein recording computational steps in implementing the second dataflow program comprises determining dependencies between computational steps when implementing the second dataflow program.

10. The method of claim 8 wherein recording computational steps in implementing the second dataflow program comprises recording an operation implemented by the second dataflow program.

11. The method of claim 8 wherein generating an informational profile comprises generating resource requirements for primitives of a plurality of architectures.

12. The method of claim 11 further comprising benchmarking the first dataflow program against the plurality of architectures.

13. The method of claim 8 further comprising benchmarking a plurality of dataflow programs defined in terms of the predefined library of primitives against the predetermined architecture.

14. A computer program product enabling evaluating an architecture for an integrated circuit device having a plurality of different types of programmable elements, the computer program product implemented in a non-transitory computer-readable medium comprising:
   computer-readable program code that generates a library of primitives for a predetermined architecture based upon the plurality of different types of programmable elements;
   computer-readable program code that converts a first dataflow program into an intermediate format;
   computer-readable program code that converts the intermediate format to a second dataflow program defined in terms of the predetermined library of primitives;
   computer-readable program code that determines dependencies between computational steps when implementing the second dataflow program during simulation of the second dataflow program for the predetermined architecture; and
   computer-readable program code that generates an implementation profile comprising information related to the implementation of the first dataflow program in an integrated circuit having the predetermined architecture based on the determining of the dependencies and resource requirements of the primitives.

15. The computer program product of claim 14 further comprising computer-readable program code that accesses resource requirements for the library of primitives.

16. The computer program product of claim 15 wherein the computer-readable program code that accesses resource requirements for the library of primitives comprises computer-readable program code that accesses known resource requirements for the library of primitives.

17. The computer program product of claim 15 wherein the computer-readable program code that accesses resource requirements for the library of primitives comprises computer-readable program code that accesses estimated resource requirements for the library of primitives.

18. The computer program product of claim 14 further comprising computer readable program code that benchmarks the first dataflow program against a plurality of architectures.

19. The computer program product of claim 14 further comprising computer-readable code that benchmarks a plurality of dataflow programs defined in terms of the predefined library of primitives against the predetermined architecture.

* * * * *